United States Patent
Hsieh et al.

(10) Patent No.: US 8,325,521 B2
(45) Date of Patent: Dec. 4, 2012

(54) STRUCTURE AND INHIBITED OPERATION OF FLASH MEMORY WITH SPLIT GATE

(75) Inventors: Chia-Ta Hsieh, Tainan (TW); Yue-Der Chih, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 238 days.

(21) Appl. No.: 12/900,608

(22) Filed: Oct. 8, 2010

(65) Prior Publication Data

US 2012/0087188 A1   Apr. 12, 2012

(51) Int. Cl.
*G11C 16/26* (2006.01)
(52) U.S. Cl. ........... 365/185.05; 365/185.2; 365/185.18; 365/185.23
(58) Field of Classification Search ............... 365/185.02
See application file for complete search history.

(56) References Cited

U.S. PATENT DOCUMENTS

| | | | | |
|---|---|---|---|---|
| 5,392,253 A | * | 2/1995 | Atsumi et al. | ........... 365/230.06 |
| 6,067,254 A | | 5/2000 | Kuo et al. | |
| 7,280,402 B2 | * | 10/2007 | Kim | .......... 365/185.17 |

* cited by examiner

*Primary Examiner* — Tan T. Nguyen
(74) *Attorney, Agent, or Firm* — Haynes and Boone, LLP (57) ABSTRACT

A method of performing a reading operation to a memory device including a plurality of flash memory cells. The method includes applying a first voltage bias to a control gate of a selected memory cell in the flash memory array and applying a second voltage bias to a word line of the selected memory cell. A control gate of an unselected memory cell in the flash memory array is grounded and a third voltage bias is applied to a word line of the unselected cell to turn off a word line channel of the unselected memory cell. The selected memory cell and unselected memory cell are configured in the memory device and are connected to different word lines. The first voltage bias and the second voltage bias have a same polarity. The third voltage bias and the second voltage bias have opposite polarities.

20 Claims, 8 Drawing Sheets

| | BL | WL | CG | CS | EG | BULK |
|---|---|---|---|---|---|---|
| WORD PGM (WITHIN THE PAGE) | | | | | | |
| selected | Idp | 1.3 | 10.5 | 4.5 | 4.5 | 0 |
| unselected | 2 | -0.5~-2.5 | 0 | 4.5 | 4.5 | 0 |
| PAGE ERS | | | | | | |
| selected | 0 | 0 | 0 | 0 | 11.5 | 0 |
| unselected | 0 | 0 | 0 | 0 | 0 | 0 |
| READ | | | | | | |
| selected | 0.8 | 2.5 | 2.5 | 0 | 0 | 0 |
| unselected | 0 | -0.5~-2.5 | 0 | 0 | 0 | 0 |

| | BL | WL | CG | CS | BULK |
|---|---|---|---|---|---|
| WORD PGM (WITHIN THE PAGE) | | | | | |
| selected | idp | 1.3 | 10.5 | 4.5 | 0 |
| unselected | 2 | -0.5 ~ -2.5 | 0 | 4.5 | 0 |
| PAGE ERS | | | | | |
| selected | 0 | 0 | -11 | 0 | 0 |
| unselected | 0 | 0 | 0 | 0 | 0 |
| READ | | | | | |
| selected | 0.8 | 2.5 | 2.5 | 0 | 0 |
| unselected | 0 | -0.5 ~ -2.5 | 0 | 0 | 0 |

| Read operation | BL | WL | CG | CS | Bulk |
|---|---|---|---|---|---|
| selected | BL voltage bias | WL voltage bias | Intermediate voltage | 0 | 0 |
| unselected | 0 | Reverse voltage bias | 0 | 0 | 0 |

STRUCTURE AND INHIBITED OPERATION OF FLASH MEMORY WITH SPLIT GATE

BACKGROUND

A typical flash memory device includes a memory array having a large number of memory cells arranged in blocks. Each of the memory cells includes a field effect transistor having a control gate and a floating gate. The floating gate holds a charge and is separated from source and drain regions in a substrate by an oxide. Each memory cell can be electrically charged by electrons injected onto the floating gate. The charge may be removed from the floating gate by tunneling to the source region or an erase gate during an erase operation. The data in flash memory cells are thus determined by the presence or absence of charge in the floating gates.

It is a trend in memory devices to scale down the device size for packing density and cost. In a conventional flash memory structure, it is a challenge to shrink the word line length due to conflicting factors. For a split gate flash memory device, shorter length of the word line results in higher channel leakage and increased bit errors. If the channel dose is increased to reduce channel leakage, it will decrease read current of the erase operation and impact the endurance window after the operation cycling. Further, the leakage may cause a reading error. There is therefore a need for a flash memory structure with a reduced leakage current and a shortened word line length.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 1:
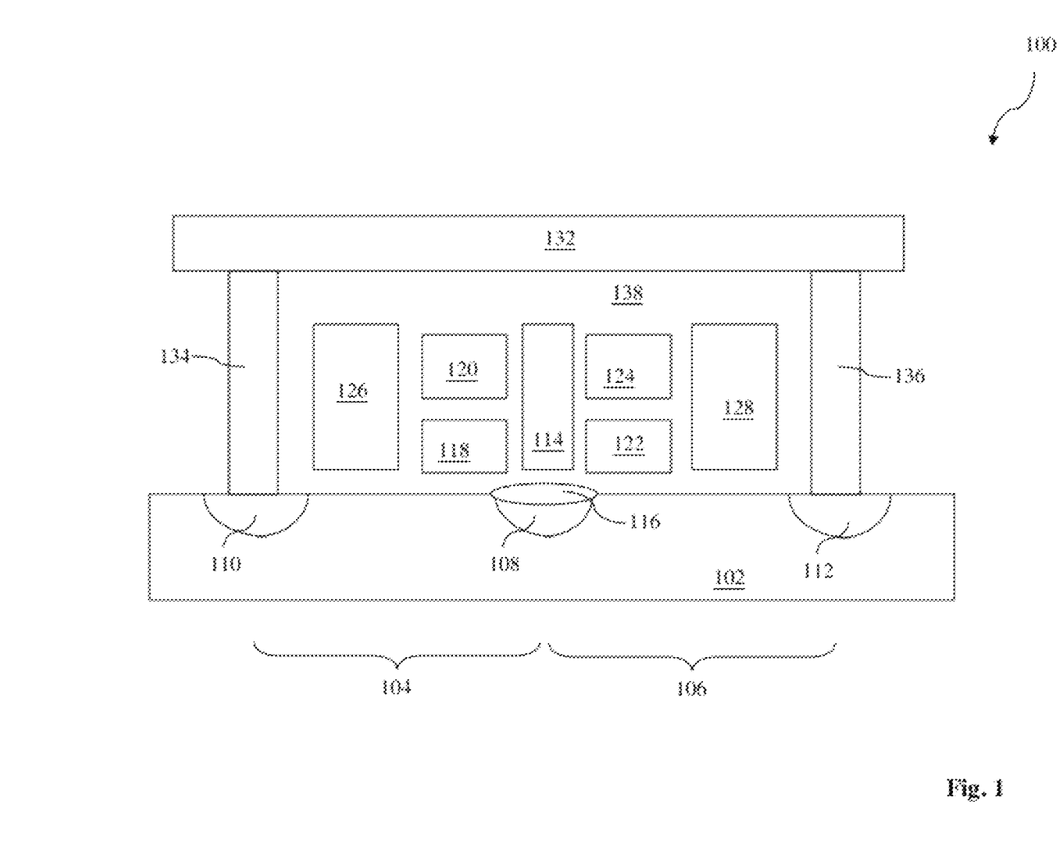
FIG. 1 is a cross-sectional view of a flash memory cell structure, according to one embodiment of the present disclosure.

FIG. 1 is a cross-sectional view of an embodiment of a flash memory structure 100. The flash memory structure 100 includes a semiconductor substrate 102. In the present embodiment, the semiconductor substrate 102 includes silicon. In other embodiments, the semiconductor substrate 102 may alternatively or additionally include other semiconductor materials such as germanium, gallium arsenic and diamond. The semiconductor substrate 102 further includes various doped features, such as n-type wells and/or p-type wells, formed by ion implantation or diffusion. The semiconductor substrate 102 also includes various isolation features, such as shallow trench isolation (STI), formed by a process known in the art, such as a process including etching to form various trenches and then deposition to fill the trench with a dielectric material.

In the present embodiment, the flash memory structure 100 includes two flash memory cells 104 and 106 defined on adjacent regions of the semiconductor substrate 102. In furtherance of the present embodiment, the two flash memory cells 104 and 106 include a split gate structure and are configured in parallel as NOR flash devices. The two flash memory cells 104 and 106 each include a field effect transistor with a floating gate. In one embodiment, the field effect transistor is a n-type field effect transistor (nFET). Alternatively, the field effect transistor can be a p-type field effect transistor (pFET). As an example for illustration, the flash memory structure 100 having nFETs is described in detail.

The flash memory structure 100 includes a common source 108 as the source for both the flash memory cells 104 and 106. The common source 108 is formed in the semiconductor substrate 102 and is positioned in a joint region of both flash memory cells 104 and 106. The common source 108 includes an n-type dopant and is formed by ion implantation or other suitable process.

The flash memory structure 100 includes drains 110 and 112 formed in the semiconductor substrate 102 and defined in the flash memory cells 104 and 106, respectively. The drains 110 and 112 include an n-type dopant and are formed by ion implantation or other suitable process. In one embodiment, the common source 108 and the drains 110 and 112 are formed in a common ion implantation procedure.

The flash memory structure 100 includes a dedicated erase gate 114 formed on the common source 108. The erase gate 114 is configured to be shared by the both flash memory cells 104 and 106. The erase gate 114 includes a conductive material formed by a proper deposition technology. In one embodiment, the erase gate 114 includes doped polycrystalline silicon (polysilicon) formed by a chemical vapor deposition (CVD) process. The dopant of the polysilicon can be introduced by an in-situ doping with the CVD process or an ion implantation after the CVD process.

In one embodiment, a thick dielectric material feature 116 is formed between the common source 108 and the erase gate 114. The thick dielectric feature 116 is positioned on the common source 108 and separates the erase gate 114 from the common source 108 such that a high voltage is applicable to the erase gate 114 for the erase operation. In one embodiment, the thick dielectric material feature 116 includes silicon oxide (SiO). In another embodiment, the thick dielectric material feature 116 having silicon oxide (SiO) is formed by thermal oxidation or CVD.

The flash memory structure 100 includes a first gate stack having a floating gate 118 and a control gate 120 configured in the flash memory cell 104. The floating gate 118 is a feature designed to store electric charges for memory purpose. The floating gate is separated from the semiconductor substrate 102 by a gate dielectric, such as silicon oxide. In one embodiment, the floating gate 118 includes a conductive material, such as doped polysilicon. In another embodiment, the floating gate 118 includes a dielectric material, such as silicon nitride (SiN) such that the electric charge is trapped in. In furtherance of this embodiment, the floating gate 118 is formed in an oxide-nitride-oxide (ONO) stack where the floating gate 118 of silicon nitride is isolated from the underlying semiconductor substrate 102 by a silicon oxide layer and is isolated from the overlying control gate 120 by another silicon oxide layer. In one embodiment, the silicon nitride layer is formed by a CVD process.

The control gate 120 is disposed over the floating gate 118 and includes a conductive material, such as doped polysilicon. The control gate 120 is separated from the floating gate 118 by a dielectric material layer, such as silicon oxide. In one embodiment, the control gate 120 is similar to a gate electrode in a conventional field effect transistor in terms of composition. During an operation of the flash memory cell 104, an electrical voltage bias is applied to the control gate 120. The field effect transistor (FET) of the flash memory cell 104 may be tuned on by the electrical voltage bias, depending on the charge state of the floating gate 118. The electrical current flowing through the channel between the common source 108 to the drain 110 can be used to determine the data stored in this cell. For one example, the charged floating gate represents the "0" state while the non-charged floating gate represents the "1" state. The first gate stack of the flash memory cell 104 having the floating gate 118 and the control gate 120 is illustrated in FIG. 1.

In one embodiment, the gate stack is configured as a silicon-oxide-nitride-oxide-silicon (SONOS) stack, representing crystalline silicon for the semiconductor substrate 102, silicon oxide for a gate dielectric layer between the semiconductor substrate 102 and the floating gate 118, silicon nitride for the floating gate 118, silicon oxide for a dielectric layer between the floating gate 118 and the control gate 120, and polysilicon for the control gate 120, respectively.

Similarly, the flash memory structure 100 includes a second gate stack having a floating gate 122 and a control gate 124 configured in the flash memory cell 106. The second gate stack defined in the flash memory cell 106 is substantially similar to the first gate stack of the flash memory cell 104 in terms of composition, formation and configuration.

Thus, a first field effect transistor is formed in the flash memory cell 104. The first field effect transistor includes the source 108, the drain 110, the floating gate 118 and the control gate 120. The first field effect transistor further includes a channel in the semiconductor substrate 102 where the channel is defined from the source 108 to the drain 110. Similarly, a second field effect transistor is formed in the flash memory cell and includes the source 108, the drain 112, the floating gate 122 and the control gate 124. The second field effect transistor further includes a channel in the semiconductor substrate 102 and defined from the source 108 to the drain 112.

The flash memory structure 100 also includes a word line 126 configured in the flash memory cell 104 and a word line 128 configured in the flash memory cell 106. Take the word line 126 as an example. The word line 126 is disposed on the semiconductor substrate 102 and is separated from the semiconductor substrate 102 by a dielectric material layer such as silicon oxide. Horizontally, the word line 126 is disposed adjacent the first the gate stack having the floating gate 118 and the control gate 120. The word line 126 is overlying a portion of the channel between the source 108 and the drain 110. This portion of the channel is referred to as the word line channel. The word line 128 is substantially similar to the word line 126 in terms of composition and formation but is defined in the flash memory cell 106. The word lines 126 and 128 include doped polysilicon. Alternatively, the word lines 126 and 128 include other suitable conductive materials.

The flash memory structure 100 also includes a bit line 132 coupled to the drain 110 of the first flash memory cell 104 and the drain 112 of the flash memory cell 106. The bit line 132 is formed in a multi-layer interconnect (MLI) structure for various electrical routing. For example, the bit line 132 is a metal line formed in the first metal layer (metal one). The bit line 132 is electrically coupled to the drain 110 through a vertical conductive feature 134 and is electrically coupled to the drain 112 through another vertical conductive feature 136. In one embodiment, the vertical conductive features 134 and 136 are contact features landing on the drains 110 and 112, respectively. For example, the vertical conductive features 134 and 136 include tungsten formed by a CVD technology, referred to as tungsten plugs.

The flash memory structure 100 also includes various dielectric materials 138 disposed for isolating various conductive features. The various dielectric materials 138 include gate dielectric material layer and interlayer dielectric (ILD). The various dielectric materials 138 can be formed by various processing steps.

In the disclosed operation to the flash memory structure 100, the reading operation is designed to have an electrical bias applied to an unselected word line. In the present embodiment, an unselected word line during a reading operation is biased to a negative voltage to force the corresponding channel to be turned off. More particularly, the negative voltage applied to the word line of the unselected memory cell turns off the word line channel.

On one hand, the negative voltage should be lower enough to effectively turn off the corresponding channel. On the other hand, the negative voltage should not be too low to cause degradation or issues to the memory cell. In one example, the negative voltage applied to the unselected word line ranges between about −0.5 V and about −2.5 V. In various embodiments, the negative bias to the unselected word line during a read operation provides advantages. In one embodiment, by implementing negative bias to the unselected word line, the read disturb issue for the split gate flash memory is solved. In another embodiment, by implementing negative bias to the unselected word line, the channel length can be shorten with reduced or eliminated leakage current.

As one example for illustration, the flash memory cell 104 is selected and the flash memory cell 106 is unselected during a reading operation. In this example, the bit line 132 is biased with a voltage of about 0.8 V. The common source 108 is grounded. The erase gate 114 is grounded as well. In the selected flash memory cell 104, the control gate 120 is biased to about 2.5 V and the word line 126 is biased to about 2.5 V. In the unselected flash memory cell 106, the control gate 124 is grounded. Especially, the word line 128 is negatively biased to a voltage ranging between about −0.5 V and about −2.5 V. In another example, the negative voltage applied to the unselected word line is below about −0.1 V. In yet another example, the negative voltage applied to the unselected word line ranges between about −0.5 V and about −5 V.

In one embodiment, the flash memory structure 100 includes other features designed and configured operable to apply a negative voltage to an unselected word line. In one example, the flash memory structure 100 includes one or more charge pumps (not shown) configured to generate negative voltage(s) and apply the generated negative voltage to the unselected word lines.

The disclosed method of reading operation is designed to bias the word line of an unselected flash memory cell such that the channel underlying the word line is turned off to eliminate the channel leakage. If the flash memory cell is a p-type transistor in which the source and drain are doped to p-type while the channel is doped to n-type, then the electrical bias applied to the word line of an unselected flash memory cell will be reversed accordingly. More specifically, for the word line of an unselected flash memory cell having p-type source/drain and n-type channel, the electrical bias applied to the unselected word line is a positive voltage to turn off the corresponding channel. In one example, the word line of an unselected flash memory cell is positively biased to a voltage ranging between about 0.5 V and about 2.5 V. In another example, the positive voltage applied to the unselected word line is greater than about 0.1 V. In yet another example, the positive voltage applied to the unselected word line ranges between about 0.5 V and about 5 V.

In the conventional reading operation, the word line of an unselected flash memory cell is grounded, which does not effectively turn off the corresponding channel, especially for a shorter channel of a flash memory cell and/or the word line threshold voltage is lower. The caused channel leakage is a barrier to scale down the channel length.

Figure 2:
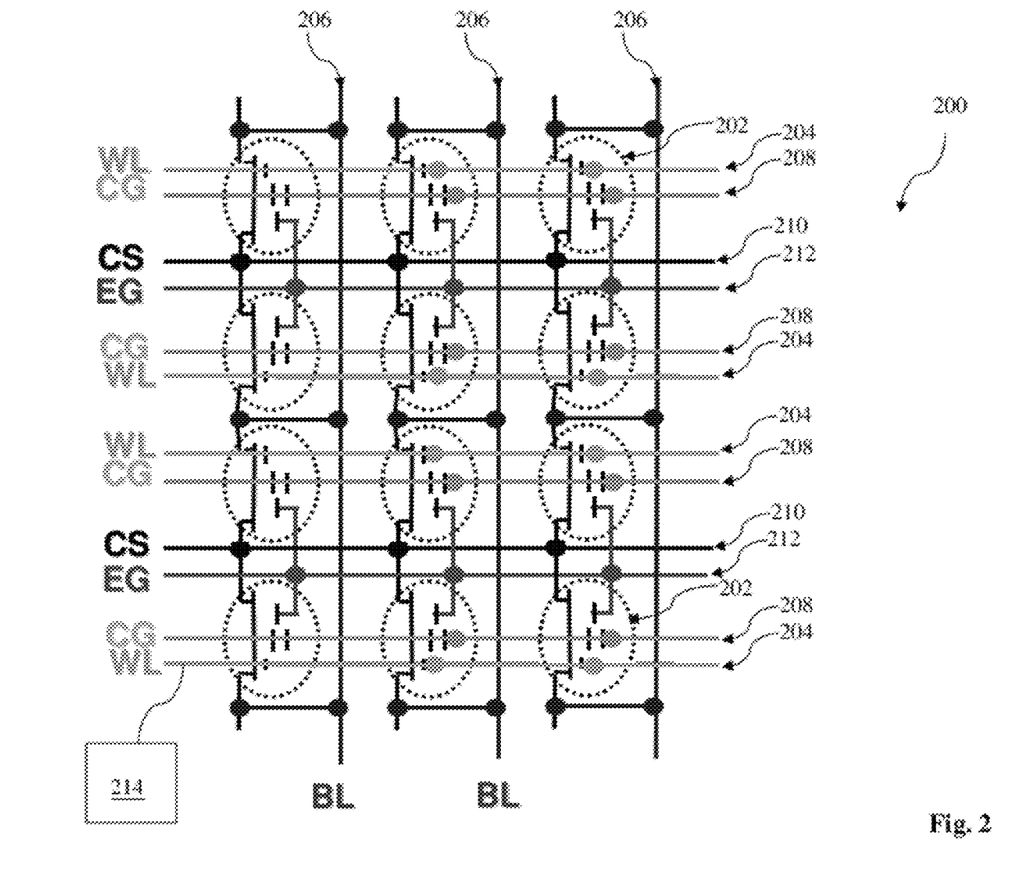
FIG. 2 is a flash memory array in accordance with one embodiment of the present disclosure.

FIG. 2 is a schematic view of a flash memory array 200 constructed according to various aspects of the present disclosure. The flash memory array 200 includes a plurality of flash memory cells 202 configured in an array. In the present embodiment, each flash memory cell 202 includes a n-type transistor having source/drain of n-type dopant and a channel of p-type dopant. The structure and operation of the flash memory array 200 are collectively described below with reference to FIG. 2.

The flash memory array 200 includes 12 exemplary flash memory cells 202 configured in three columns and four rows. The 12 flash memory cells 202 are grouped into 6 paired cells. Each paired cells include two flash memory cells sharing a common source. In one embodiment, each paired cells is substantially similar to the flash memory structure 100 of FIG. 1. The flash memory array 200 includes word lines (WL) 204 each coupled to the channels of the corresponding flash memory cells 202 in the same row. The flash memory array 200 also includes bit lines (BL) 206 each coupled to the drains of the corresponding flash memory cells 202 in the same column. The flash memory array 200 includes control gate lines (CG) 208 each coupled to the control gates of the corresponding flash memory cells 202 in the same row. The flash memory array 200 includes common source lines (CS) 210 each coupled to the common sources in the same row for source bias. The flash memory array 200 further includes erase gate lines 212 each coupled to the erase gates of the corresponding flash memory cells 202 in the same row. Each erase gate is also shared by the paired flash memory cells.

In the disclosed method of reading operation to the flash memory array 200, an electrical bias is applied to an unselected word line. In the present embodiment, the unselected word line during the reading operation is biased to a negative voltage to force the corresponding channel to be turned off. In one example, the negative voltage applied to the unselected word line ranges between about −0.5 V and about −2.5 V.

In one embodiment, the flash memory array 200 further includes one or more on-chip charge pumps 214 configured to generate negative voltage(s) and apply the negative voltage to the unselected word line.

If the flash memory cell is a p-type transistor in which the source and drain are doped to p-type while the channel is doped to n-type, then electrical bias applied to the word line of an unselected flash memory cell will be reversed accordingly. More specifically, for the word line of an unselected flash memory cell having p-type source/drain and n-type channel, the electrical bias to the unselected word line is a positive voltage to turn off the corresponding channel. In one example, the word line of the unselected flash memory cell is positively biased to a voltage ranging between about 0.5 V and about 2.5 V.

Figure 3:
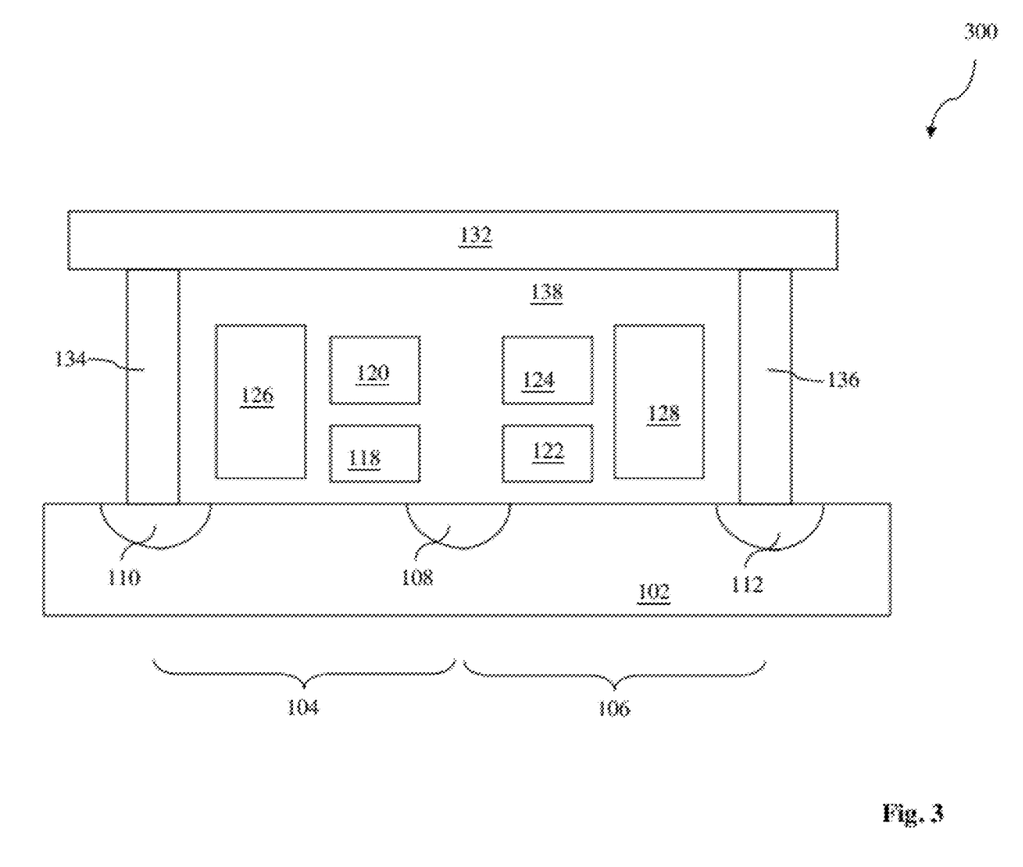
FIG. 3 is a cross-sectional view of a flash memory cell structure, according to another embodiment of the present disclosure.

FIG. 3 is a cross-sectional view of another embodiment of a flash memory structure 300. The flash memory structure 300 is similar to the flash memory structure 100 but the flash memory structure 300 does not have a dedicated erase gate.

Similarly, the reading operation to the flash memory structure 300 is designed to be similar to the reading operation of the flash memory structure 100. During a reading operation, an electrical bias is applied to an unselected word line such that the word line channel is turned off to eliminate the channel leakage. In the present embodiment, an unselected word line during the reading operation is biased to a negative voltage to force the corresponding channel to be turned off. In one embodiment, the flash memory structure 300 further includes one or more charge pumps (not shown) configured to generate negative voltage(s) and apply the generated negative voltage to the unselected word lines.

Similarly, if the flash memory cell is a p-type transistor in which the source and drain are doped to p-type while the channel is doped to n-type, then electrical bias applied to the word line of an unselected flash memory cell will be reversed accordingly. More specifically, for the word line of an unselected flash memory cell having p-type source/drain and n-type channel, the electrical bias is a positive voltage to turn off the corresponding channel.

Figure 4:
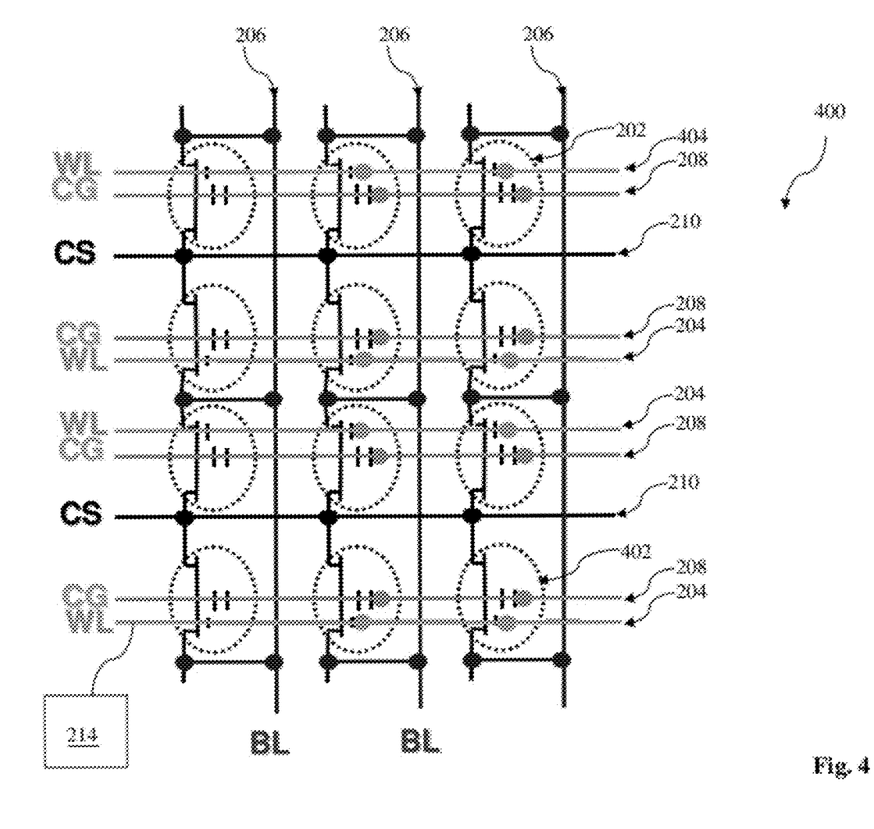
FIG. 4 is a flash memory array in accordance with another embodiment of the present disclosure.

FIG. 4 is a schematic view of another embodiment of a flash memory array 400 constructed according to various aspects of the present disclosure. The flash memory array 400 includes a plurality of flash memory cells 402 configured in an array. In the present embodiment, each flash memory cell 402 includes a n-type transistor having a source/drain of n-type dopant and a channel of p-type dopant. The structure and operation of the flash memory array 400 are described below.

The flash memory array 400 includes exemplary 12 flash memory cells 402 configured in three columns and four rows. The 12 flash memory cells 402 are grouped into 6 paired cells. Each paired cells include two flash memory cells sharing a common source. In one embodiment, each paired cells are substantially similar to the two memory cells in the flash memory structure 300 of FIG. 3. The flash memory array 400 includes word lines (WL) 204 each coupled to the channels of the corresponding flash memory cells 402 in the same row. The flash memory array 400 includes bit lines (BL) 206 each coupled to the drains of the corresponding flash memory cells 402 in the same column. The flash memory array 400 includes control gate lines (CG) 208 each coupled to the control gates of the corresponding flash memory cells 402 in the same row. The flash memory array 400 also includes common source lines (CS) 210 each coupled to the common sources in the same row for source bias.

In the disclosed operation to the flash memory array 400, the reading operation is designed to be similar to the reading operation to the flash memory array 200. In the present embodiment, an unselected word line during a reading operation is biased to a negative voltage to force the corresponding channel to be turned off. In one embodiment, the flash memory array 400 further includes one or more charge pumps 214 configured to generate negative voltage(s) and apply the generated negative voltage to the unselected word lines.

The disclosed method of reading operation includes biasing the word line of an unselected flash memory cell such that the channel underlying the word line is turned off to eliminate the channel leakage. If the flash memory cell is a p-type transistor in which the source and drain are doped to p-type while the channel is doped to n-type, then the electrical bias applied to the word line of an unselected flash memory cell will be reversed accordingly. More specifically, for the word line of an unselected flash memory cell having p-type source/drain and n-type channel, the electrical bias is a positive voltage to turn off the corresponding channel.

Other embodiments and modifications may be implemented without departing from the spirit of the present disclosure. In one embodiment, the electrical bias applied to an unselected word line during a reading operation can also be implemented during a programming (writing) operation. In another embodiment, dielectric spacers are formed on the control gates of the flash memory structure 100 of FIG. 1 or the flash memory structure 300 of FIG. 3. In one example, the dielectric spacers include silicon oxide and silicon nitride.

Figure 5:
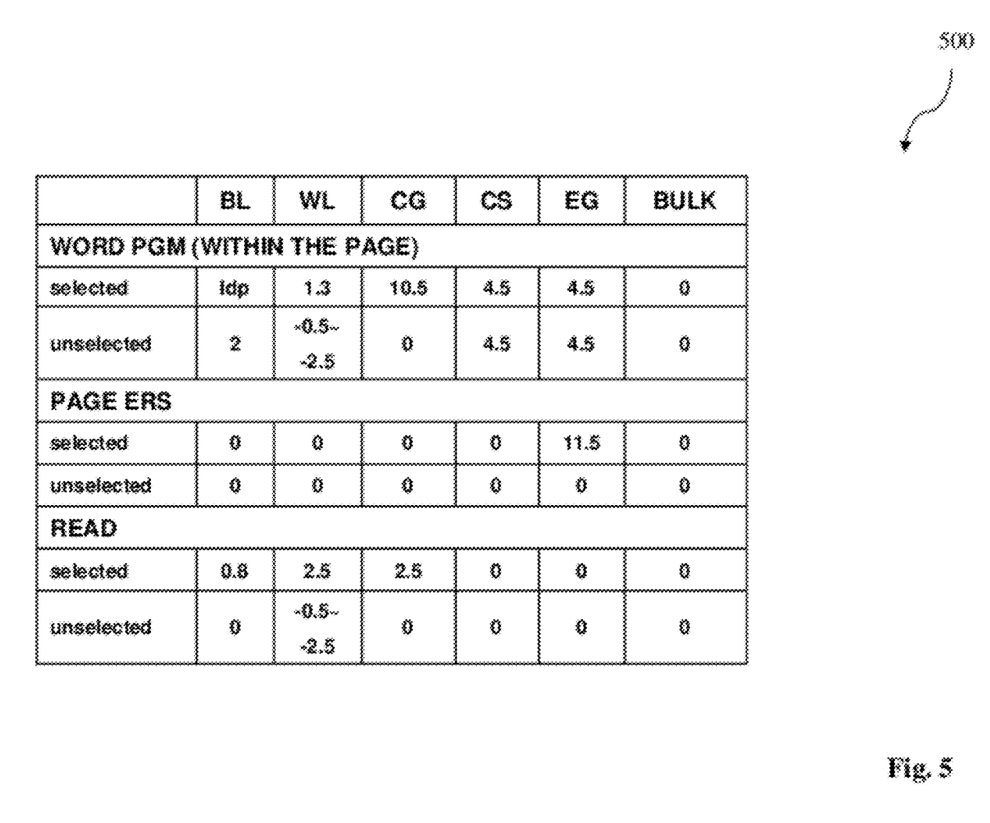
FIG. 5 is a table illustrating an example of electrical voltages applied to different features of selected and unselected cells of the flash memory array of FIG. 2.

FIG. 5 is a table 500 illustrating an example of electrical voltages to be applied to various features of selected and unselected flash memory cells in a flash memory array having dedicated erase gates during reading, programming and erasing operations. One example of the flash memory array is the flash memory array 200 of FIG. 2. Table 500 includes three operations: word programming ("WORD PGM"), erasing ("PAGE ERS") and reading ("READ") to selected cells ("selected") and unselected cells ("unselected"), respectively. The various features where the electrical voltages are applied to, respectively, include bit line ("BL"), word line ("WL"), control gate ("CG"), common source ("CS"), erase gate ("EG") and the substrate ("BULK"). The electrical voltages in Table 500 have a unit of volt (V). For the selected cell during a programming operation, the bit line is coupled to have a constant electrical current ("Idp") or alternatively is biased to a voltage of about 0.4 V.

Figure 6:
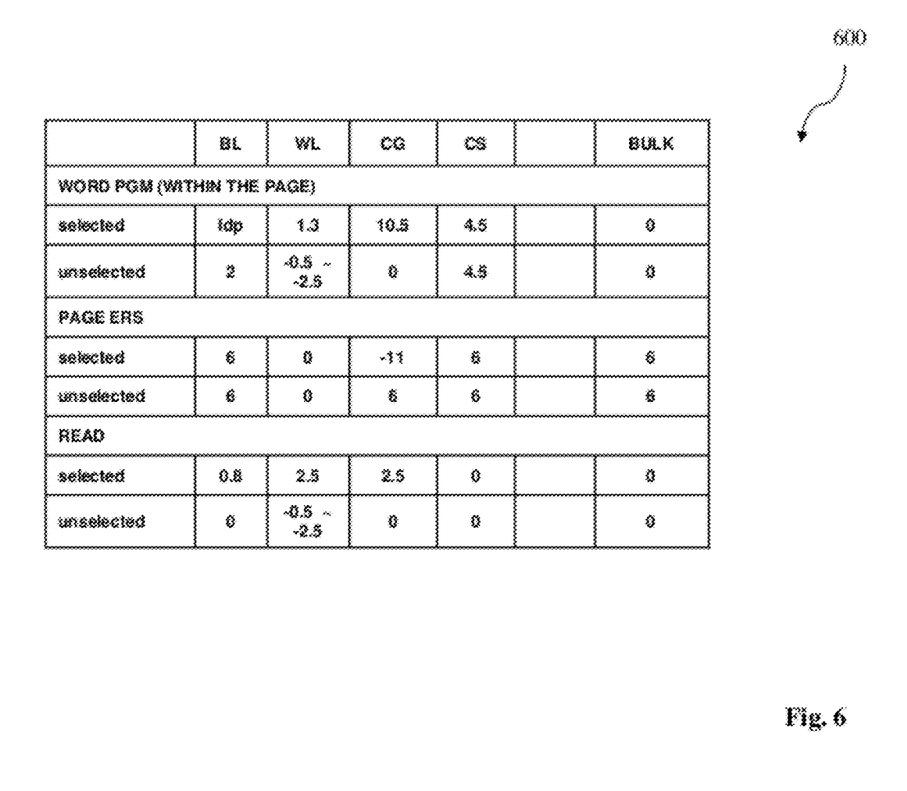
FIG. 6 is a table illustrating an example of electrical voltages applied to different features of selected and unselected cells of the flash memory array of FIG. 4.

FIG. 6 is a table 600 illustrating an example of electrical voltages to be applied to various features of selected and unselected flash memory cells of a flash memory array without dedicated erase gate during reading, programming and erasing operations. One example of the flash memory array is the flash memory array 400 of FIG. 4. Table 600 includes three operations: word programming ("WORD PGM"), erasing ("PAGE ERS") and reading ("READ") to selected cells ("selected") and unselected cells ("unselected"), respectively. The various features where the electrical voltages are applied, respectively, include bit line ("BL"), word line ("WL"), control gate ("CG"), common source ("CS") and the substrate ("BULK"). The electrical voltages in Table 500 have a unit of volt (V). For the selected cell during a programming operation, the bit line is coupled to have a constant electrical current ("Idp").

Figure 7:
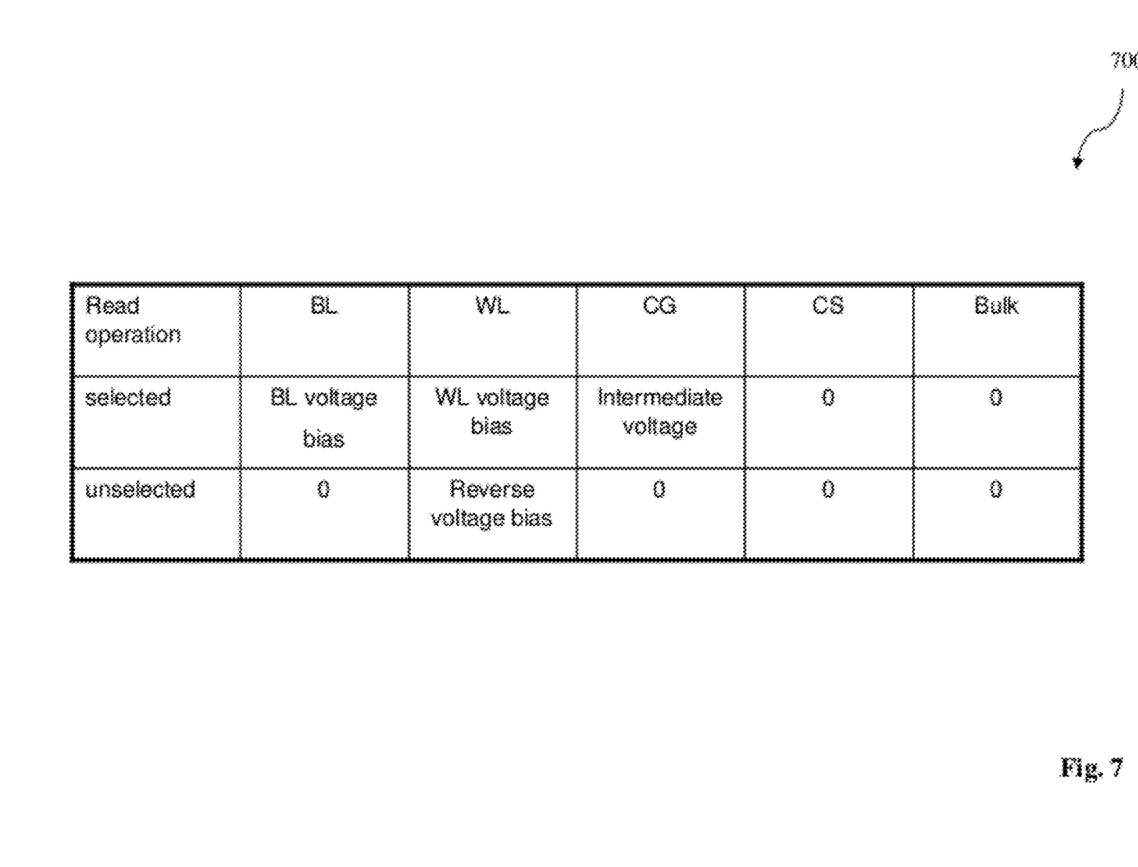
FIG. 7 is a table illustrating an embodiment of electrical voltages applied to different features of a flash memory array.

FIG. 7 is a table 700 illustrating an example of electrical voltages to be applied to various features of selected and unselected flash memory cells of a flash memory array in a reading operation. One example of the flash memory array is the flash memory array 200 of FIG. 2. Another example of the flash memory array is the flash memory array 400 of FIG. 4. The selected memory cell and the unselected memory cells are connected to different word lines. The various features of a flash memory cell where the electrical voltages are applied, respectively, include bit line ("BL"), word line ("WL"), control gate ("CG"), common source ("CS") and the substrate ("BULK").

For the selected cell, the bit line is biased to a first voltage bias, referred to as BL voltage bias. In one example, the BL voltage bias is about 0.8 V. In this example and various other examples below, the flash memory cells include n-type field effect transistors each having a split gate structure. For the selected cell, the word line is biased to a second voltage bias, referred to as WL voltage bias. In one example, the WL voltage bias is about 2.5 V. The control gate of the selected flash memory cell is biased to an intermediate voltage (or intermediate voltage bias). The flash memory cell includes two threshold voltages, corresponding to two states of the associated floating gate, respectively. The two states of the floating gate includes being charged or not charged. The intermediate voltage is between the two threshold voltages of the flash memory cell. Thus, when the intermediate voltage is applied to the control gate of the selected flash memory cell, the corresponding field effect transistor is turned on or remain off, depending on the charge state of the corresponding floating gate. The stored date in the selected flash memory cell is thus determined through the electrical current in the channel between the source and drain. The intermediate voltage bias and the second voltage bias have the same polarity (both are positive or negative). In one example, the intermediate voltage is about 2.5 V. In another example, the intermediate voltage and the WL voltage bias are substantially the same. The common source of the selected flash memory cell is grounded. The semiconductor substrate is grounded as well in this embodiment.

For the unselected cell, the bit line is grounded in one embodiment. The word line of the unselected cell is biased to a reverse voltage bias (or reverse voltage). The reverse voltage is in a range to effectively turn off the corresponding channel. More specifically, the reverse voltage is in a range to turn off the corresponding word line channel. The reverse voltage bias and the second voltage bias have opposite polarities. The reverse voltage bias is negative when the second voltage is positive. The reverse voltage bias is positive when the second voltage is negative. Particularly, the reverse voltage bias is a negative voltage if the corresponding flash memory cell includes an n-type field effect transistor. The negative voltage can be provided by an in-chip charge pump. In one example, the reverse voltage bias is lower than −0.1 V. In another example, the reverse voltage bias ranges between about −0.5 V and about −2.5 V. In yet another embodiment, the reverse voltage bias ranges between about −0.5 V and about −5 V.

If the unselected flash memory cell includes a p-type field effect transistor, then the reverse voltage is a positive voltage. In one example, the reverse voltage bias is higher than 0.1 V. In another example, the reverse voltage bias ranges between about 0.5 V and about 2.5 V. In yet another embodiment, the reverse voltage bias ranges between about 0.5 V and about 5 V.

For the unselected flash memory cell, the control gate is grounded in one embodiment. In other embodiments, the common source and the substrate are grounded.

Figure 8:
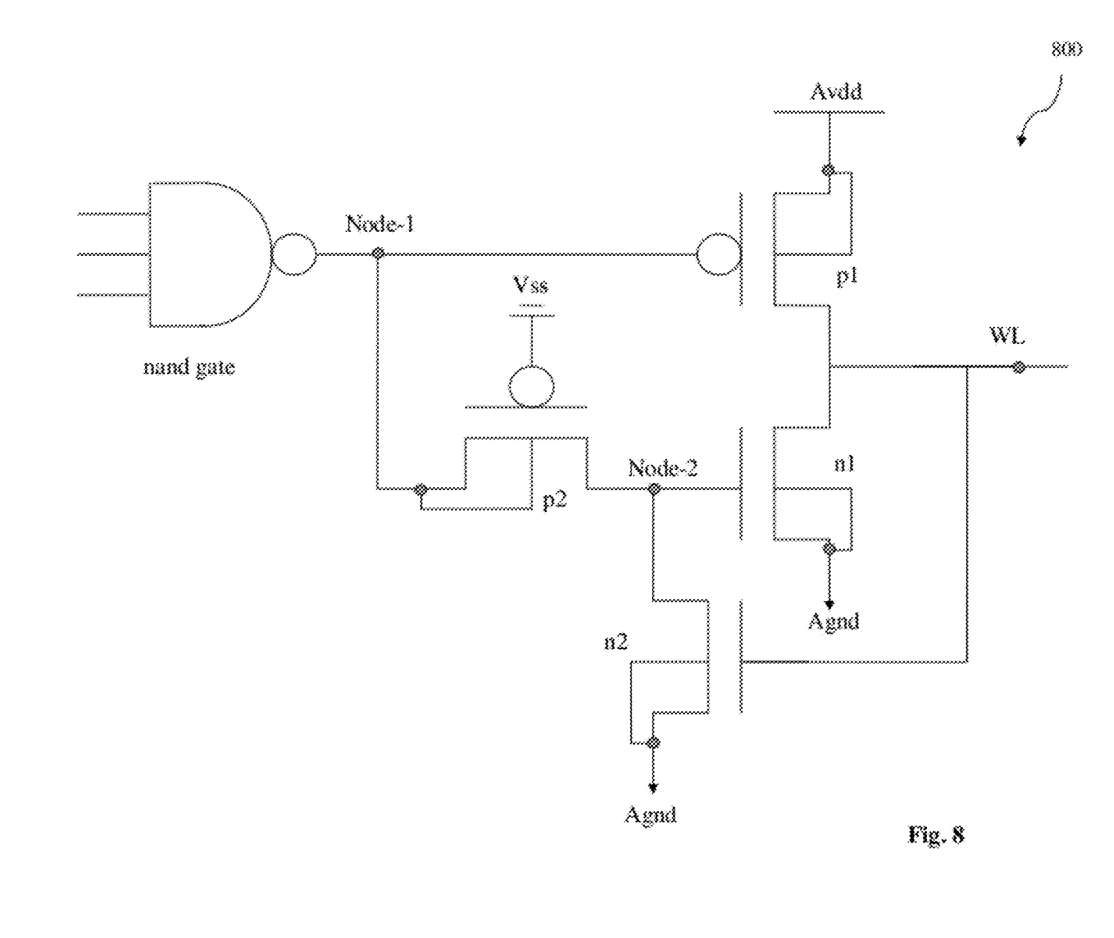
FIG. 8 is a schematic view of a circuit incorporated in a flash memory cell structure according to one embodiment of the present disclosure.

FIG. 8 is a schematic view of a circuit 800 coupled with a flash memory cell, such as those in FIGS. 1 and 3, or incorporated in a flash memory cell array, such as those in FIGS. 2 and 4, according to one embodiment of the present disclosure. The circuit 800 is a word-line driver (or word-line decoder) connected to a word line that is further connected to a plurality of flash memory cells, such as the one of FIG. 1 or FIG. 3.

The word-line driver 800 is designed operable for applying to the word line with a voltage, such as those provided in the second column under "WL" in the table of FIG. 6. The voltage to the word line by the word-line driver, during read or programming cycle, is positive if selected or negative if unselected according to the present disclosure.

The word-line driver 800 includes a NAND gate coupled to the pre-decoder and designed to take one or more inputs, such as three or four inputs. The NAND gate is connected to a first node, labeled as "Node-1" in FIG. 8.

The word line driver 800 includes a first p-type transistor (labeled as "p1"), such as a p-type metal-oxide-semiconductor (PMOS) field-effect transistor (FET). The word line driver 800 also includes a first n-type transistor (labeled as "n1"), such as a n-type metal-oxide-semiconductor (NMOS) FET. The first p-type transistor p1 and the first n-type transistor n1 are properly configured to provide an input to the word line.

In the configuration of transistors p1 and n1, the drains of p1 and n1 are electrically connected and coupled to the word line (labeled as "WL"). The source of transistor p1 is electrically connected to the power line Vcc (labeled as "Avdd"). The source of transistor n1 is electrically connected to a power line (labeled as "Agnd"). The gate of transistor p1 is electrically connected to the first node (Node-1). The gate of transistor n1 is electrically connected to a second node (labeled as "Node-2"). Furthermore, the substrate of p1 is electrically connected to its source and is biased to the power line Avdd. The substrate of n1 is electrically connected to its source and is biased to the power line Agnd.

The word-line driver 800 further includes a second p-type transistor ("p2"), such as a PMOS, and a second n-type transistor ("n2"), such as a NMOS. The transistor p2 is configured such that the source is connected to the first node (Node-1), the drain is connected to the second node (Node-2), and the gate is connected to a power line or grounded ("Vss"). The transistor n2 is configured such that the source is connected to the power line Agnd, the drain is connected to the second node (Node-2), and the gate is connected to the word line (WL).

The operations of the word-line driver 800 are provided in various embodiments. When one or more word lines are selected, the line Agnd is powered from a negative voltage source (such as a charge pump designed operable to provide a negative voltage) having a negative voltage, such as −0.5 V or even lower one. The inputs of the NAND gate from the pre-decoder output are ALL-1 so that the first node (Node-1) connected with the NAND gate output will be 0 V ("0v"). The voltage "0v" of the first node (Node-1) turns on the transistor p1 and activates the word line to the voltage of Avdd (=1.3 V for programming and 2.5 V for read in one example). The voltage on the power line Avdd passes to the word line and the gate of the transistor n2, turns on the transistor n2, and pulls down the second node (Node-2) to the voltage of Agnd that further turns off the transistor n1.

When one or more word lines are unselected, the line Agnd is powered from a negative voltage source having a negative voltage, such as −0.5 V or even lower one. Some inputs of the NAND gate from the pre-decoder output are 0 V ("zero") so that the first node (Node-1) will be the voltage of Avdd. The voltage of Avdd on the first node (Node-1) turns off the transistor p1, and is passed to the second node (Node-2) through the transistor p2. As a result, the word line is pulled down to Agnd and the transistor n2 is turned off.

When all word lines are unselected, Agnd is 0 V. All inputs of the NAND gate from the pre-decoder output will be 0 V ("zero") so that the first node (Node-1) connected to the output of the NAND gate will be the voltage of Avdd. The voltage of Avdd on the first node (Node-1) turns off the transistor p1 and is passed to the second node (Node-2) through the transistor p2. As a result, the word line is pulled down to 0 V and the transistor n2 is turned off.

Thus, the present disclosure describes a method of performing a reading operation to a memory device including a plurality of flash memory cells. The method includes applying a first voltage bias to a control gate of a selected memory cell in the flash memory array and applying a second voltage bias to a word line of the selected memory cell. A control gate of an unselected memory cell in the flash memory array is grounded and a third voltage bias (or reverse voltage bias or reverse voltage) is applied to a word line of the unselected cell to turn off a word line channel of the unselected memory cell. The selected memory cell and unselected memory cell are configured in the memory device and are connected to different word lines. The first voltage bias and the second voltage bias have a same polarity. The third voltage bias and the second voltage bias have opposite polarities.

In one embodiment of the method, the first voltage bias is an intermediate voltage between two threshold voltages of the selected memory cell. In another embodiment, the first voltage bias and the second voltage bias are substantially same in magnitude. In yet another embodiment, the method further includes grounding a source of the unselected memory cell. The source of the unselected memory cell is a common source shared with an adjacent memory cell. In yet another embodiment, the method further includes grounding a dedicated erase gate of the unselected memory cell. In yet another embodiment, the method further includes grounding a semiconductor substrate wherein the selected and unselected memory cells formed on. In yet another embodiment, the reverse voltage bias ranges between about −0.5 V and about −2.5 V when the unselected memory cell includes a n-type field effect transistor having a split gate structure. In yet another embodiment, the reverse voltage bias is lower than about −0.1 V when the unselected memory cell includes a n-type field effect transistor having a split gate structure. In yet another embodiment, the reverse voltage bias is provided by an on-chip charge pump. In yet another embodiment, the reverse voltage bias ranges between about 0.5 V and about 2.5 V when the unselected memory cell includes a p-type field effect transistor having a split gate structure.

The present disclosure also provides another method of performing a reading operation for a flash memory array. The reading operation includes applying an intermediate voltage to a control gate of a selected memory cell, wherein the intermediate voltage is between two threshold voltages of the selected memory cell. A voltage bias is applied to a word line of the selected memory cell. A control gate of an unselected memory cell is grounded and a reverse voltage is applied to a word line of the unselected cell to turn off a word line channel of the unselected memory cell. The reverse voltage has an opposite polarity to the intermediate voltage. The selected memory cell and unselected memory cell are configured in the flash memory array.

In one embodiment of the reading operation, the intermediate voltage and the voltage bias are substantially same. In another embodiment, the reading operation includes comprising grounding a bit line of the unselected memory cell. In yet another embodiment, the reading operation includes grounding a dedicated erase gate of the unselected memory cell. In yet another embodiment, the reverse voltage bias ranges between about −0.5 V and about −5 V when the unselected memory cell includes a n-type field effect transistor having a split gate structure. In yet another embodiment, the reverse voltage bias ranges between about 0.5 V and about 5

V when the unselected memory cell includes a p-type field effect transistor having a split gate structure.

The present disclosure also describes a flash memory structure. The flash memory structure includes a common source on a semiconductor substrate; and a first and second drains on the semiconductor substrate. The first drain is configured in one side of the common source and spaced away from the common source, defining a first channel between the common source and the first drain. The second drain is configured in an opposite side of the common source and spaced away from the common source, defining a second channel between the common source and the second drain. The flash memory structure further includes a first gate stack on a semiconductor substrate and partially overlying the first channel. The first gate stack includes a first floating gate and a first control gate on the floating gate. The flash memory structure further includes a second gate stack on a semiconductor substrate and partially overlying the second channel. The second gate stack includes a second floating gate and a second control gate on the floating gate. The flash memory structure further includes a first word line partially overlying the first channel and configured horizontally between the first gate stack and the first drain; a second word line partially overlying the second channel and configured horizontally between the second gate stack and the second drain; a bit line coupled to the first and second drains; and a charge pump formed on the semiconductor substrate, designed operable to generate a negative voltage and configured to provide the negative voltage to one of the first and second word lines to turn off a corresponding channel.

In one embodiment, the flash memory structure further includes a word-line driver having an output line coupled to one of the first word line and the second word line. The word-line driver includes a first p-type transistor (p1) having a first gate connected to a first node, a first source connected to a first power line (Avdd), and a first drain connected to the output line; a first n-type transistor (n1) having a second gate connected to a second node, a second source connected to a second power line (Agnd), and a second drain connected to the output line; a second p-type transistor (p2) having a third gate connected to a third power line (Vss), a third source connected to the first node, and a third drain connected to the second node; a second n-type transistor (n2) having a fourth gate connected to the output line, a fourth source connected to the second power line Agnd, and a fourth drain connected to the second node; and a NAND gate connected to the first node and designed to having at least one pre-decoder input. In another embodiment, the first power line Avdd is connected to a positive voltage source; the second power line Agnd is connected to a negative voltage source; and the third power line Vss is grounded. In yet another embodiment, the second power line Agnd is powered by a charge pump designed operable to provide a negative voltage. In yet embodiment, the flash memory structure further includes a dedicated erase gate on the semiconductor substrate and configured between the first and second gate stacks. In yet another embodiment, the common source, the first drain and the second drain includes an n-type dopant.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of performing a read operation to a memory device including a plurality of flash memory cells, the method comprising:
    applying a first voltage bias to a control gate of a selected memory cell;
    applying a second voltage bias to a first word line connected to the selected memory cell;
    grounding a control gate of an unselected memory cell; and
    applying a third voltage bias to a second word line connected to the unselected cell to turn off a word line channel of the unselected memory cell, wherein
        the selected memory cell and unselected memory cell are configured in the memory device and are connected to different word lines;
        the first voltage bias and the second voltage bias have a same polarity; and
        the third voltage bias and the second voltage bias have opposite polarities.

2. The method of claim 1, wherein the first voltage bias is an intermediate voltage between two threshold voltages of the selected memory cell.

3. The method of claim 1, wherein the first voltage bias and the second voltage bias are substantially same in magnitude.

4. The method of claim 1, further comprising grounding a source of the unselected memory cell.

5. The method of claim 1, wherein the source of the unselected memory cell is a common source shared with an adjacent memory cell.

6. The method of claim 1, further comprising grounding a dedicated erase gate of the unselected memory cell.

7. The method of claim 1, further comprising grounding a semiconductor substrate in which the selected and unselected memory cells are formed.

8. The method of claim 1, wherein the third voltage bias ranges between about −0.5 V and about −2.5 V when the unselected memory cell includes an n-type field effect transistor having a split gate structure.

9. The method of claim 1, wherein the third voltage bias is lower than about −0.1 V when the unselected memory cell includes an n-type field effect transistor having a split gate structure.

10. The method of claim 9, wherein the third voltage bias is provided by an on-chip charge pump.

11. The method of claim 1, wherein the third voltage bias ranges between about 0.5 V and about 2.5 V when the unselected memory cell includes a p-type field effect transistor having a split gate structure.

12. A method for performing a reading operation to a flash memory array, the method comprising:
    applying an intermediate voltage to a control gate of a selected memory cell, wherein the intermediate voltage is between two threshold voltages of the selected memory cell;
    applying a voltage bias to a first word line connected to the selected memory cell;
    grounding a control gate of an unselected memory cell; and
    applying a reverse voltage to a second word line connected to the unselected cell to turn off a word line channel of the unselected memory cell, wherein
        the selected memory cell and unselected memory cell are configured in the flash memory array; and
        the reverse voltage has an opposite polarity to the intermediate voltage.

13. The method of claim 12, wherein the intermediate voltage and the voltage bias are substantially same.

14. The method of claim 12, further comprising grounding a bit line of the unselected memory cell.

15. The method of claim 12, further comprising grounding a dedicated erase gate of the unselected memory cell.

16. The method of claim 12, wherein the reverse voltage bias ranges between about −0.5 V and about −5 V when the unselected memory cell includes a n-type field effect transistor having a split gate structure.

17. The method of claim 12, wherein the reverse voltage bias ranges between about 0.5 V and about 5 V when the unselected memory cell includes a p-type field effect transistor having a split gate structure.

18. A flash memory structure comprising:
a common source on a semiconductor substrate;
a first drain and a second drain on the semiconductor substrate, wherein
the first drain is configured on one side of the common source and spaced away from the common source, defining a first channel between the common source and the first drain; and
the second drain is configured on an opposite side of the common source and spaced away from the common source, defining a second channel between the common source and the second drain;
a first gate stack on a semiconductor substrate and partially overlying the first channel, wherein the first gate stack includes a first floating gate and a first control gate on the floating gate;
a second gate stack on a semiconductor substrate and partially overlying the second channel, wherein the second gate stack includes a second floating gate and a second control gate on the floating gate;
a first word line partially overlying the first channel and configured horizontally between the first gate stack and the first drain;
a second word line partially overlying the second channel and configured horizontally between the second gate stack and the second drain;
a bit line coupled to the first and second drains; and
a charge pump formed on the semiconductor substrate, designed operable to generate a negative voltage and configured to provide the negative voltage to one of the first and second word lines to turn off a corresponding channel.

19. The flash memory structure of claim 18, further comprising a word-line driver having an output line coupled to one of the first word line and the second word line, wherein the word-line driver includes
a first p-type transistor (p1) having a first gate connected to a first node, a first source connected to a first power line (Avdd), and a first drain connected to the output line;
a first n-type transistor (n1) having a second gate connected to a second node, a second source connected to a second power line (Agnd), and a second drain connected to the output line;
a second p-type transistor (p2) having a third gate connected to a third power line (Vss), a third source connected to the first node, and a third drain connected to the second node;
a second n-type transistor (n2) having a fourth gate connected to the output line, a fourth source connected to the second power line Agnd, and a fourth drain connected to the second node; and
a NAND gate connected to the first node and designed to having at least one pre-decoder input.

20. The flash memory structure of claim 19, wherein
the first power line Avdd is connected to a positive voltage source;
the second power line Agnd is connected to a negative voltage source; and
the third power line Vss is grounded.

\* \* \* \* \*